United States Patent
Swain et al.

(10) Patent No.: US 7,985,612 B2
(45) Date of Patent: Jul. 26, 2011

(54) METHOD AND DEVICE FOR REDUCING CROSSTALK IN BACK ILLUMINATED IMAGERS

(75) Inventors: Pradyumna Kumar Swain, Princeton, NJ (US); Mahalingam Bhaskaran, Lawrenceville, NJ (US)

(73) Assignee: SRI International, Menlo Park, CA (US)

( * ) Notice: Subject to any disclaimer, the term of this patent is extended or adjusted under 35 U.S.C. 154(b) by 461 days.

(21) Appl. No.: 12/132,721

(22) Filed: Jun. 4, 2008

(65) Prior Publication Data

US 2009/0206377 A1 Aug. 20, 2009

Related U.S. Application Data

(60) Provisional application No. 61/029,648, filed on Feb. 19, 2008.

(51) Int. Cl.
*H01L 31/00* (2006.01)
*H01L 21/00* (2006.01)

(52) U.S. Cl. ............... 438/60; 438/57; 438/70; 438/72; 257/292; 257/437; 257/E21.001; 257/E21.566; 257/E31.001

(58) Field of Classification Search ............ 257/292, 257/432, 437, 446, E31.001, E21.001, E21.1, 257/E21.566, E27.139, E27.146, E27.161, 257/E27.162; 438/60, 57, 70–72, 144, 228, 438/358, 481, 667, 668
See application file for complete search history.

(56) References Cited

U.S. PATENT DOCUMENTS

| | | | |
|---|---|---|---|
| 6,008,126 A | 12/1999 | Leedy | |
| 7,160,753 B2 | 1/2007 | Williams | |
| 7,238,583 B2 | 7/2007 | Swain et al. | |
| 2001/0019361 A1 | 9/2001 | Savoye | |
| 2005/0139833 A1 | 6/2005 | Janesick et al. | |
| 2006/0038252 A1 | 2/2006 | Mouli | |
| 2007/0235829 A1 | 10/2007 | Levine et al. | |
| 2008/0038864 A1 | 2/2008 | Yoo et al. | |
| 2008/0061390 A1 | 3/2008 | Swain et al. | |

OTHER PUBLICATIONS

PCT/US2008/65708 International Search Report, dated Aug. 22, 2008.

*Primary Examiner* — Victor Mandala
*Assistant Examiner* — Whitney Moore
(74) *Attorney, Agent, or Firm* — Lowenstein Sandler PC

(57) ABSTRACT

A method and resulting device for reducing crosstalk in a back-illuminated imager is disclosed, comprising providing a substrate comprising an insulator layer and a seed layer substantially overlying the insulator layer, an interface being formed where the seed layer comes in contact with the insulator layer; forming an epitaxial layer substantially overlying the seed layer, the epitaxial layer defining plurality of pixel regions, each pixel region outlining a collection well for collecting charge carriers; and forming one of an electrical, optical, and electrical and optical barrier about the outlined collection well extending into the epitaxial layer to the interface between the seed layer and the insulator layer. The seed layer and the epitaxial layer of the device have a net dopant concentration profile which has an initial maximum value at the interface of the seed layer and the insulator layer and which decreases monotonically with increasing distance from an interface within an initial portion of the semiconductor substrate and the epitaxial layer.

21 Claims, 10 Drawing Sheets

METHOD AND DEVICE FOR REDUCING CROSSTALK IN BACK ILLUMINATED IMAGERS

CROSS-REFERENCE TO RELATED APPLICATIONS

This application claims the benefit of U.S. provisional patent application No. 61/029,648 filed Feb. 19, 2008, the disclosure of which is incorporated herein by reference in its entirety.

FIELD OF THE INVENTION

The present invention relates generally to imagers, and more particularly, to a method and resulting device for reducing crosstalk in back illuminated imagers.

BACKGROUND OF THE INVENTION

CMOS or CCD image sensors are of interest in a wide variety of sensing and imaging applications in a wide range of fields including consumer, commercial, industrial, and space electronics. Imagers based on charge coupled devices (CCDs) are currently the most widely utilized. CCDs are employed either in front or back illuminated configurations. Front illuminated CCD imagers are more cost effective to manufacture than back illuminated CCD imagers such that front illuminated devices dominate the consumer imaging market. Front-illuminated imagers, however, have significant performance limitations such as low fill factor/low sensitivity. The problem of low fill factor/low sensitivity is typically due to shadowing caused by the presence of opaque metal bus lines, and absorption by an array circuitry structure formed on the front surface in the pixel region of a front-illuminated imager. Thus, the active region of a pixel is typically relatively small (low fill factor) in large format (high-resolution) front-illuminated imagers.

Back-illuminated semiconductor (CCD and CMOS) imaging devices are advantageous over front-illuminated imagers for high fill factor, better overall efficiency of charge carrier generation and collection, and are suitable for small pixel arrays. Fabrication of thinned back illuminated imagers has several challenges. One challenge is the loss of charge carriers near the back surface due to inherent dangling bonds present at the silicon back surface, which reduces Quantum Efficiency (QE) if the backside of the thinned imager is not pinned. Eliminating this problem requires additional treatment at the backside of the device, which adds to the complexity of the fabrication process.

A second challenge is absorption of charge carriers within the epitaxial layer, which prevents charge carriers from reaching processing components on the front side, which reduces sensitivity and efficiency of the device. In back illuminated imagers, photon radiation that enters the backside of the imagers generates charge carriers in the silicon epitaxial layer. The location of the charge generation in the epitaxial layer depends on the absorption length of the incident photon, which in turn depends on its wavelength. Photons with longer wavelengths, such as red, penetrate deeper into the epitaxial layer as compared to shorter wavelengths, such as blue. To generate maximum charge carriers from all the incident photons of different wavelengths requires an appropriate thickness for the epitaxial layer. Further, charge carriers generated near the back side of the imager should be driven to the front side as quickly as possible in order to avoid horizontal drift of carriers into adjacent pixels, which may smear an image.

Additional challenges include excessive thinning of wafers, which poses yield issues such as stress in the thinned wafer, and uniformity of thickness, etc. Fabrication cost of back illuminated imagers can be higher than for front illuminated imagers due to thinning and backside treatment.

To overcome these problems, techniques employing ultra thin silicon-on-insulator (SOI) wafers for the fabrication of back illuminated CCD/CMOS imagers have been developed, an example of which is described in U.S. Pat. No. 7,238,583 (hereinafter "the '583 Patent"), which is incorporated by reference herein in its entirety. In the '583 Patent, a thin semiconductor seed layer is supported by an ultra-thin substrate and an insulator layer made of an electrically insulating material such as silicon dioxide. An epitaxial layer may be grown substantially overlying the seed layer to an appropriate thickness to accommodate devices that are to operate at wavelengths from less than 100 nanometers (deep ultraviolet) to more than 3000 nanometers (far infrared). In order to drive charge carriers to the front side without recombination near the back side, and to prevent horizontal drift, a large electric field needs to be generated within the device. This is accomplished by doping the insulation and seed layers at an initial concentration, growing the epitaxial layer on the seed layer, and then causing the dopant to diffuse into the epitaxial layer such that the final net doping profile has its highest concentration in the insulator layer, with the net doping profile decreasing monotonically within the insulator layer and epitaxial layer.

This technique solves the aforementioned problems. However, as technology advances in the fabrication of CMOS devices, the current CMOS imaging market demands high pixel density, and hence small pixel size for imagers. The scaling of pixel size also results in a lower bias supply. This limits the drift field that can be produced in a small pixel back illuminated imager array. Charge carriers that are generated near the backside due to short wavelength photons will tend to diffuse to the adjacent pixel, if there is not enough drift field. This phenomenon, which is referred as crosstalk, can be worse for a small pixel back illuminated array. Furthermore, photons that have a non-perpendicular incident angle relative to the back-side surface may generate carriers in adjacent pixels, which is a form of optical crosstalk.

Accordingly, what would be desirable, but has not yet been provided, are a method and resulting device that reduces crosstalk in back illuminated imagers. Such a method and device would employ the doping profile technique disclosed in the '583 Patent where SOI wafers are used as a starting material.

SUMMARY OF THE INVENTION

The above-described problems are addressed and a technical solution achieved in the art by providing a method and resulting device for reducing crosstalk in a back-illuminated imager, comprising providing a substrate comprising an insulator layer and a seed layer substantially overlying the insulator layer, an interface being formed where the seed layer comes in contact with the insulator layer; forming an epitaxial layer substantially overlying the seed layer, the epitaxial layer defining plurality of pixel regions, each pixel region outlining a collection well for collecting charge carriers; and forming one of an electrical, optical, and electrical and optical barrier about the outlined collection well extending into the epitaxial layer to the interface between the seed layer and the insulator layer. The seed layer and the epitaxial layer of the device have a net dopant concentration profile which has an initial maximum value at an interface of the seed layer and the insulator layer and which decreases monotonically with increasing distance from the interface within an initial portion of the semiconductor substrate and the epitaxial layer. At least one imaging component is formed at least partially overlying and extending into the epitaxial layer. A plurality of alignment keys are formed substantially overlying the epitaxial layer.

The electrical barrier can be formed about the outlined collection well using implanted dopants; an etched trench filled with an electrically insulating material; a combination of implanted dopants and an etched trench filled with an electrically insulating material. An electrical/optical barrier can be formed by filling trenches with an electrically insulating material about outlined collection wells, opening trenches about the inner filled trenches, and filling the outer trenches with dopants.

In another embodiment, a method for reducing crosstalk in a back-illuminated imager includes the steps of providing a substrate comprising an insulator layer and a seed layer substantially overlying the insulator layer, an interface being formed where the seed layer comes in contact with the insulator layer; defining pixel regions in the seed layers each pixel region outlining a collection well for collecting charge carriers; depositing an electrically insulating layer substantially overlying the seed layer; patterning the electrically insulating layer such that it forms a ring about location of the outlined collection well; and growing an the epitaxial layer substantially about the seed layer and the ring using an epitaxial lateral overgrowth (ELO) technique. The seed layer and the epitaxial layer of the device have a net dopant concentration profile which has an initial maximum value at the interface of the seed layer and the insulator layer and which decreases monotonically with increasing distance from an interface within an initial portion of the semiconductor substrate and the epitaxial layer.

BRIEF DESCRIPTION OF THE DRAWINGS

The present invention will be more readily understood from the detailed description of an exemplary embodiment presented below considered in conjunction with the attached drawings and in which like reference numerals refer to similar elements and in which.

It is to be understood that the attached drawings are for purposes of illustrating the concepts of the invention and may not be to scale.

DETAILED DESCRIPTION OF THE INVENTION

Figure 1A:
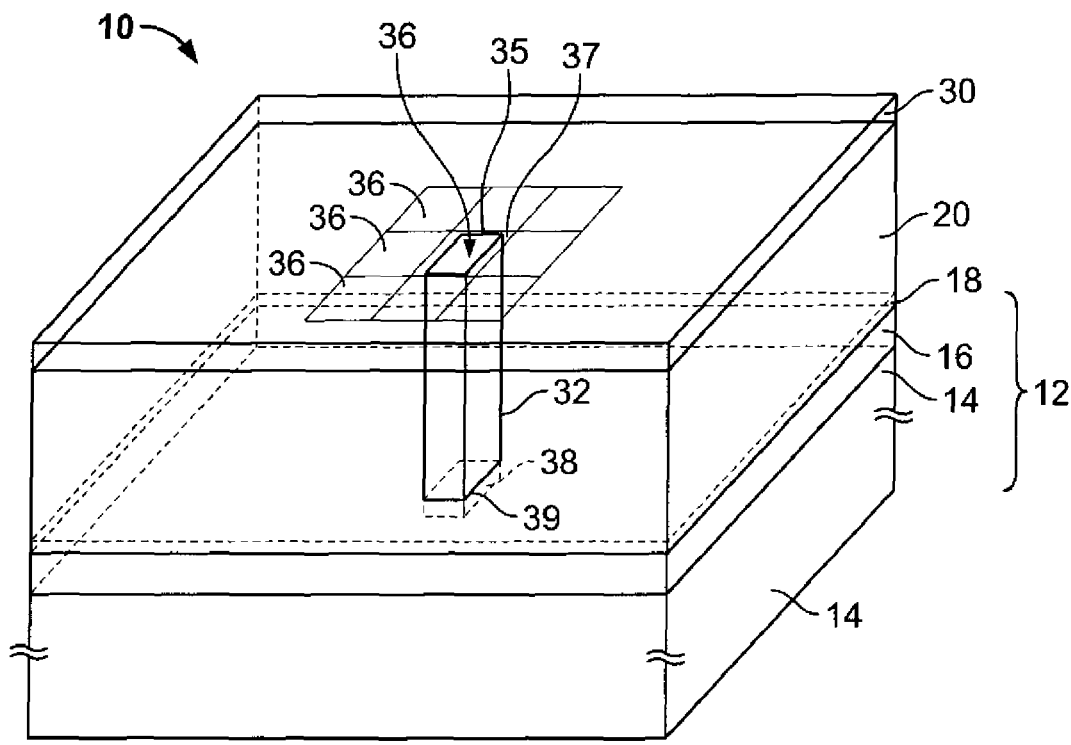
FIG. 1A is a perspective view of a back-illuminated imager that reduces crosstalk, constructed according to an embodiment of the present invention.
Figure 1B:
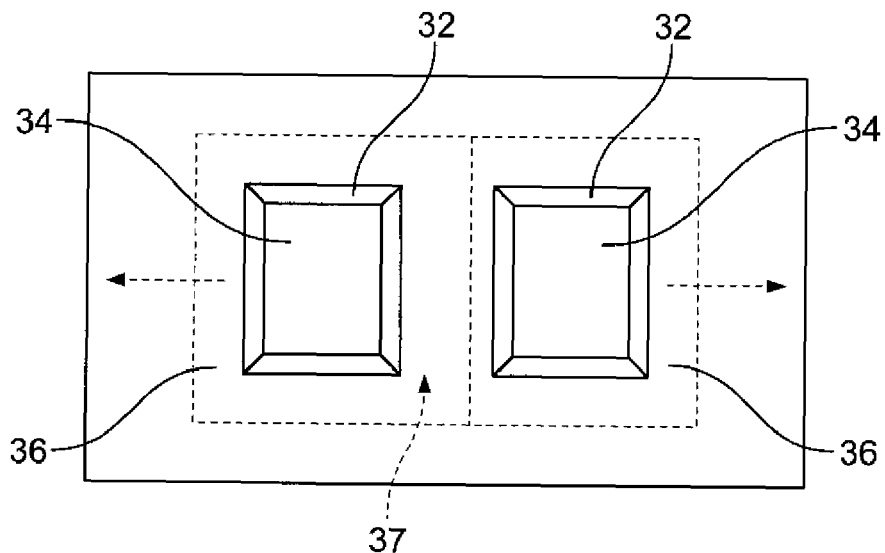
FIG. 1B is a top down view of a portion of FIG. 1, showing electrical/optical barriers forming rings about pixel collection wells.

Referring now to FIGS. 1A and 1B, there is shown a back-illuminated imager 10, constructed according to an embodiment of the present invention. The imager 10 may include an initial substrate 12, sometimes referred to in the art as a semiconductor-on-insulator (SOI) substrate, which is composed of handle wafer 14 to provide mechanical support during processing, an insulator layer 16 (buried oxide layer), and seed layer 18. The handle wafer 14 may be a standard silicon wafer used in fabricating integrated circuits. Alternatively, the handle wafer 14 may be any sufficiently rigid substrate composed of a material which is compatible with the steps of the method disclosed herein. The handle wafer, at later processing steps, can be removed completely. Insulator layer 16 may comprise an oxide of silicon with a thickness ranging up to 1 micrometer. Among other embodiments, the thickness of insulator layer 16 may fall in a range from about 10 nm to about 5000 nm. If the handle wafer 14 is completely remove, the insulator layer 16 may also be thinned to produce an anti-reflective layer. Seed layer 18 may be comprised of crystalline silicon having a thickness from about 5 nanometers to about 100 nanometers.

SOI substrates are available commercially and are manufactured by various known methods. In one method, thermal silicon oxide is grown on silicon wafers. Two such wafers are joined with oxidized faces in contact and raised to a high temperature. In some variations, an electric potential difference is applied across the two wafers and the oxides. The effect of these treatments is to cause the oxide layers on the two wafers to flow into each other, forming a monolithic bond between the wafers. Once the bonding is complete, the silicon on one side is lapped and polished to the desired thickness of seed layer 18, while the silicon on the opposite side of the oxide forms handle wafer 14. The oxide forms insulator layer 16.

Another method of fabricating an SOI substrate begins with obtaining a more standard semiconductor-on-insulator (SOI) wafer in which the seed layer 18 has a thickness in the range from about 100 nm to about 1000 nm. A thermal oxide is grown on the semiconductor substrate, using known methods. As the oxide layer grows, semiconductor material of the semiconductor substrate is consumed. Then the oxide layer is selectively etched off, leaving a thinned semiconductor substrate having a desired seed layer thickness.

SOI substrates manufactured by an alternative method, known as Smart Cut.™., are sold by Soitec, S.A.

Seed layer 18 may comprise silicon (Si), Germanium (Ge), SiGe alloy, a III-V semiconductor, a II-VI semiconductor, or any other semiconductor material suitable for the fabrication of optoelectronic devices.

An epitaxial layer 20 is formed on the seed layer 18, using seed layer 18 as the template. Depending on the material of seed layer 18, epitaxial layer 20 may comprise silicon (Si), Germanium (Ge), SiGe alloy, a III-V semiconductor, a II-VI semiconductor, or any other semiconductor material suitable for the fabrication of optoelectronic devices. Epitaxial layer 20 may have a thickness from about 1 micrometer to about 50 micrometers. The resistivity of the epitaxial layer 20 can be controlled by controlling the epitaxial growth process.

Figure 2:
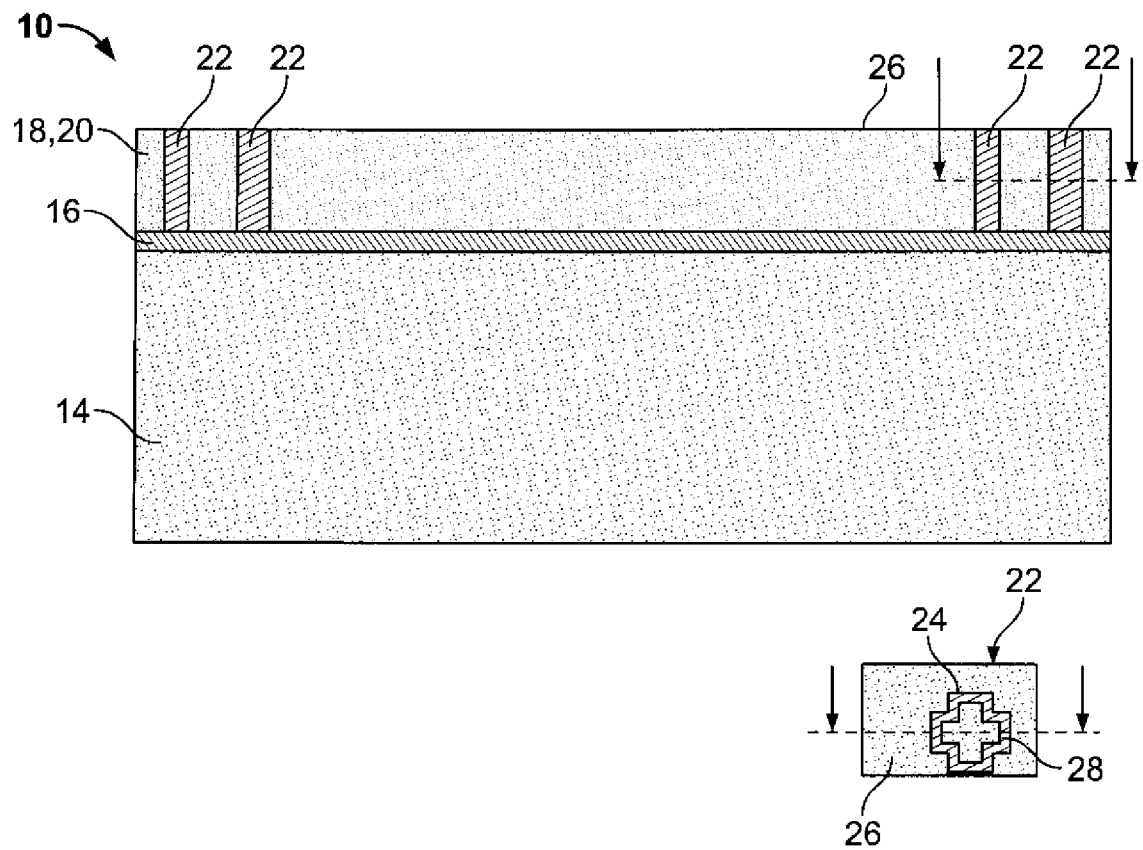
FIG. 2 shows a side view and top down view of the alignment keys formed in the epitaxial layer, according to an embodiment of the present invention.

Referring now to FIGS. 1A and 2, alignment keys 22 are printed on and etched into the epitaxial layer 20. The alignment keys 22 can be used to align subsequent layers during the imager fabrication process. The use of alignment keys can result in highly accurate alignment of about 0.1 micrometer or less for subsequently deposited layers. Using photolithography, key patterns 24 are printed on a top portion 26 of the epitaxial layer 20. A trench plasma etch process can be used to etch the underlying epitaxial layer 20 below the key patterns 24 until the etched away silicon is stopped by the underlying insulator/buried oxide layer 16. The open trenches 28 are then filled with an electrically insulating material such as an oxide of silicon, silicon carbide, silicon nitride, or polysilicon.

Referring again to FIGS. 1A and 1B, one or more imaging structures 30, such as but not limited to CCD or CMOS imaging structures, may be fabricated on the epitaxial layer 20. These imaging structures 30 may include charge-coupled device (CCD) components, CMOS imaging components, photodiodes, avalanche photodiodes, phototransistors, or other optoelectronic devices, in any combination. Also included may be other electronic components such as CMOS transistors, bipolar transistors, capacitors, or resistors (not shown). After fabrication of the one or more imaging structures 30 is completed, the handle wafer 14 is removed by etching from the back side of the back-illuminated imager 10. The insulator layer 16 can be thinned to a desired thickness such that it acts as an anti-reflective layer to a desired incoming wavelength of light. Alternatively, the insulating layer 16 can also be removed completely, and another suitable material can be deposited on the remaining epitaxial layer 20 which can be of a desired thickness so as to act as an anti-reflective coating/layer. Optical components (not shown) can be bonded to the back side of the imager 10 using the alignment keys 22 as precision guides. The one or more optical components can comprise color filters and micro-lenses to produce wavelength dependent signals.

Before the imaging structures 30 are formed, one of electrical, optical, and electrical and optical barriers 32 are formed in the epitaxial layer 20 about the collection wells 34 of each of the pixels 36 comprising the imager 10. Each of the collection wells 34 and barriers 32 are separated from each other by regions 37 where the transfer/readout circuit elements belonging to the imaging structures 30 are fabricated. The barriers 32 preferably extend vertically from about the top surface 35 of the epitaxial layer down to the surface 38, 39 of one of the seed layer 18 and the insulator layer 16, respectively. The barriers 32 may be formed by one of several techniques and of several types of materials to be described hereinbelow.

Method Embodiment-1

Use of Higher Energy Implants to Create Electrical Barriers

Figure 3:
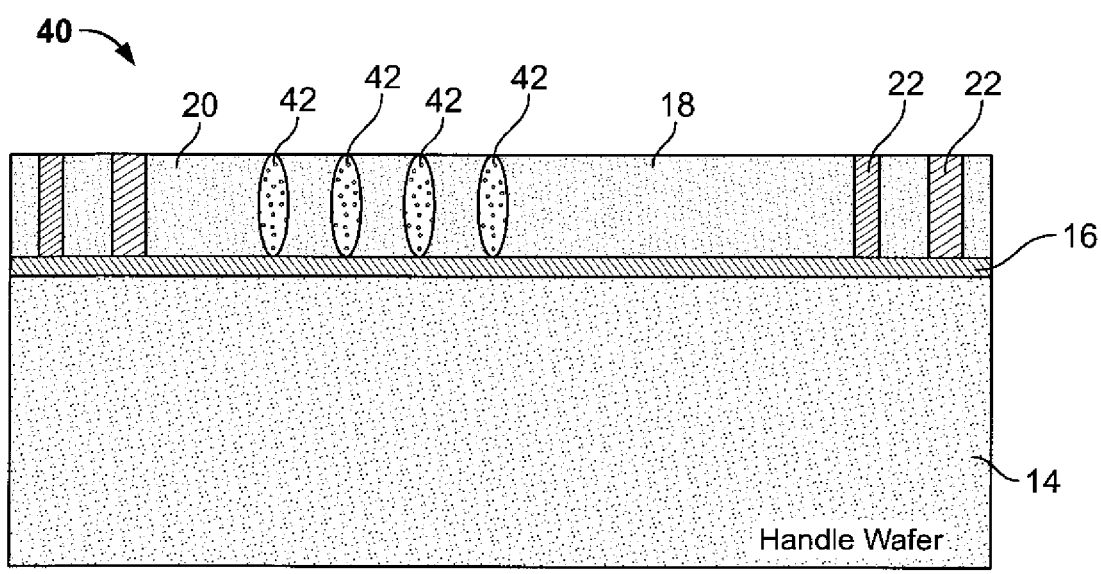
FIG. 3 shows a cross-section of an imager having a plurality of isolation barriers formed therein by means of implanted dopants, according to an embodiment of the present invention.
Figure 4:
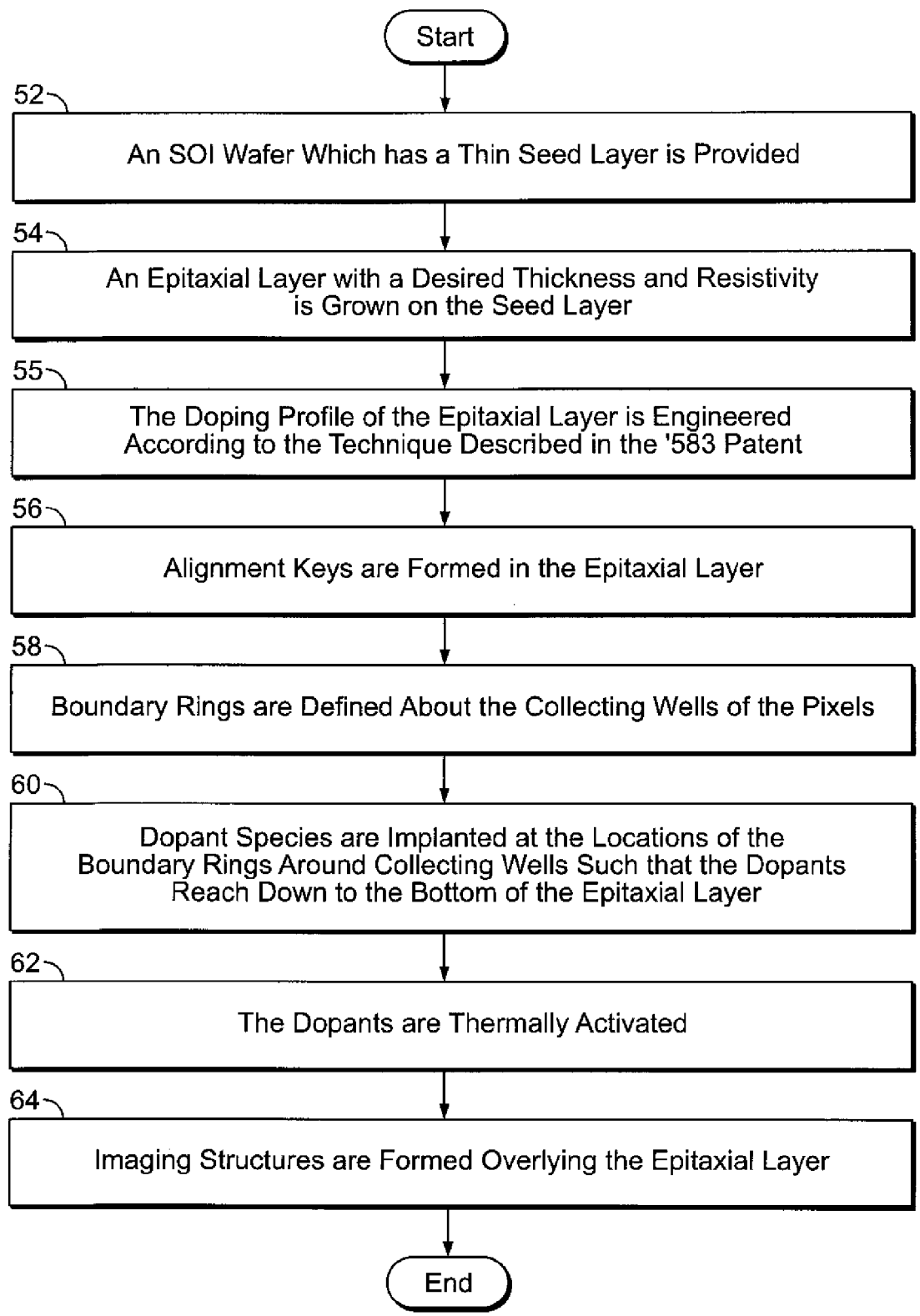
FIG. 4 is a flow diagram of a method for forming isolation barriers made from high energy implants according to the embodiment of FIG. 3.

FIG. 3 shows a cross-section of an imager 40 having a plurality of isolation barriers formed therein by means of implanted dopants. The high-energy implants 42 are formed from available techniques in the fabrication industry. Today's high-energy (on the order of MeV) implanters are capable of implanting species in the range of 2-10 um deep into silicon. Referring now to FIGS. 1-4, a method 50 for forming isolation barriers made from high energy implants is described as follows:

At step 52, an SOI wafer 12 which has a thin Si seed layer 18 is provided. At step 54, an epitaxial layer 20 with a desired thickness (2-10 um) and resistivity is grown on the seed layer 18. At step 55, the doping profile of the epitaxial layer 20 is engineered according to the technique described in the '583 Patent. At step 56, alignment keys 22 are formed in the epitaxial layer 20. Sub-steps include printing alignment keys on the epitaxial layer 20 using photolithography; trench etching the epitaxial layer 20; and filling the trenches with an electrically insulating material, such as an oxide (preferably of silicon). At step 58, boundary rings are defined about the collecting wells of the pixels using photolithography and with the aid of the alignment keys formed earlier. At step 60, using high-energy implanters, appropriate dopant species are implanted at the locations of the boundary rings around collecting wells such that the dopants reach down to the interface between the insulator layer 16 and the seed layer 18. For a p-type substrate, the high energy implants (dopants) can be formed by ion implanting p-type impurities into a p-type epitaxial layer (and likewise n-type impurities for an n-type epitaxial layer). At step 62, the dopants can be thermally activated. At step 64, imaging structures 30 are formed overlying the epitaxial layer 20. The dopants can be activated by processes such as rapid thermal annealing so that the diffusion can be minimized. The dopants, once activated, provide an electrical isolation barrier such that carriers generated inside a collecting well will not diffuse into adjacent pixels.

Method Embodiment-2

Use of Oxide Trenches to Create Electrical Barriers

Figure 5:
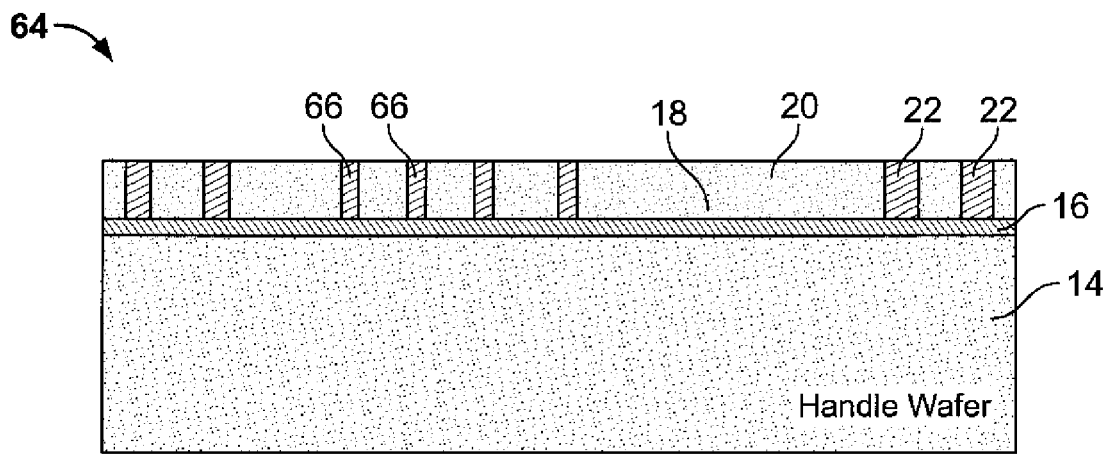
FIG. 5 shows a cross-section of an imager having a plurality of isolation barriers formed therein by means of oxide trenches, according to an embodiment of the present invention.

FIG. 5 shows a cross-section of an imager 64 having a plurality of isolation barriers formed therein by means of oxide trenches. The oxide trenches 66, being insulators, act as electrical barriers to generated charge carriers and confine them within pixel collecting wells. One advantage of this method is that the barrier trenches 66 can be defined along with the alignment keys, eliminating the need for another photo mask. Referring now to FIGS. 1-2, 5 and 6, a method 68 for forming isolation barriers made from oxide trenches is described as follows:

At step 70, an SOI wafer 12 which has a thin Si seed layer 18 is provided. At step 72, an epitaxial layer 20 with a desired thickness (2-10 um) and resistivity is grown on the seed layer 18. At step 73, the doping profile of the epitaxial layer 20 is engineered according to the technique described in the '583 Patent. At step 74, trench outlines are formed about collection wells collecting along with alignment keys 22 on the surface of the epitaxial layer 20 using photolithography. At step 76, the epitaxial layer 20 is trench etched down to the buried oxide (insulation) layer 16. At step 78, the trenches 22, 66 are filled with an electrically insulating material such as an oxide of silicon. At step 80, the tops of the trenches 22, 66 are planarized. At step 82, imaging structures 30 are formed overlying the epitaxial layer 20.

One concern with employing the method 68 is that the trench etch step may result in unnecessary traps at the interfaces between epitaxial layer silicon and trench filled oxide. However, the number traps can be reduced by thermal annealing.

Method Embodiment-3

Figure 7:
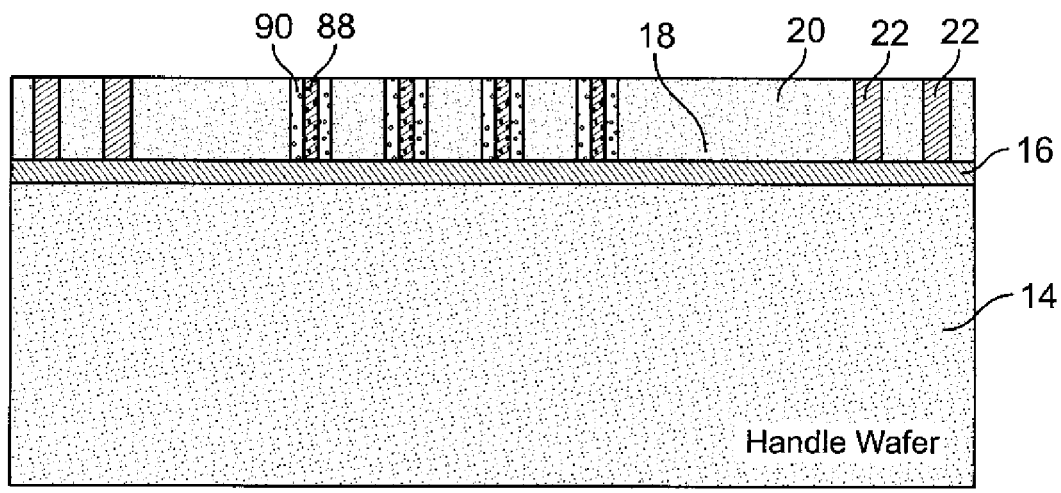
FIG. 7 shows a cross-section of an imager having a plurality of isolation barriers formed therein by means of both oxide trenches and high energy implants, according to an embodiment of the present invention.
Figure 6:
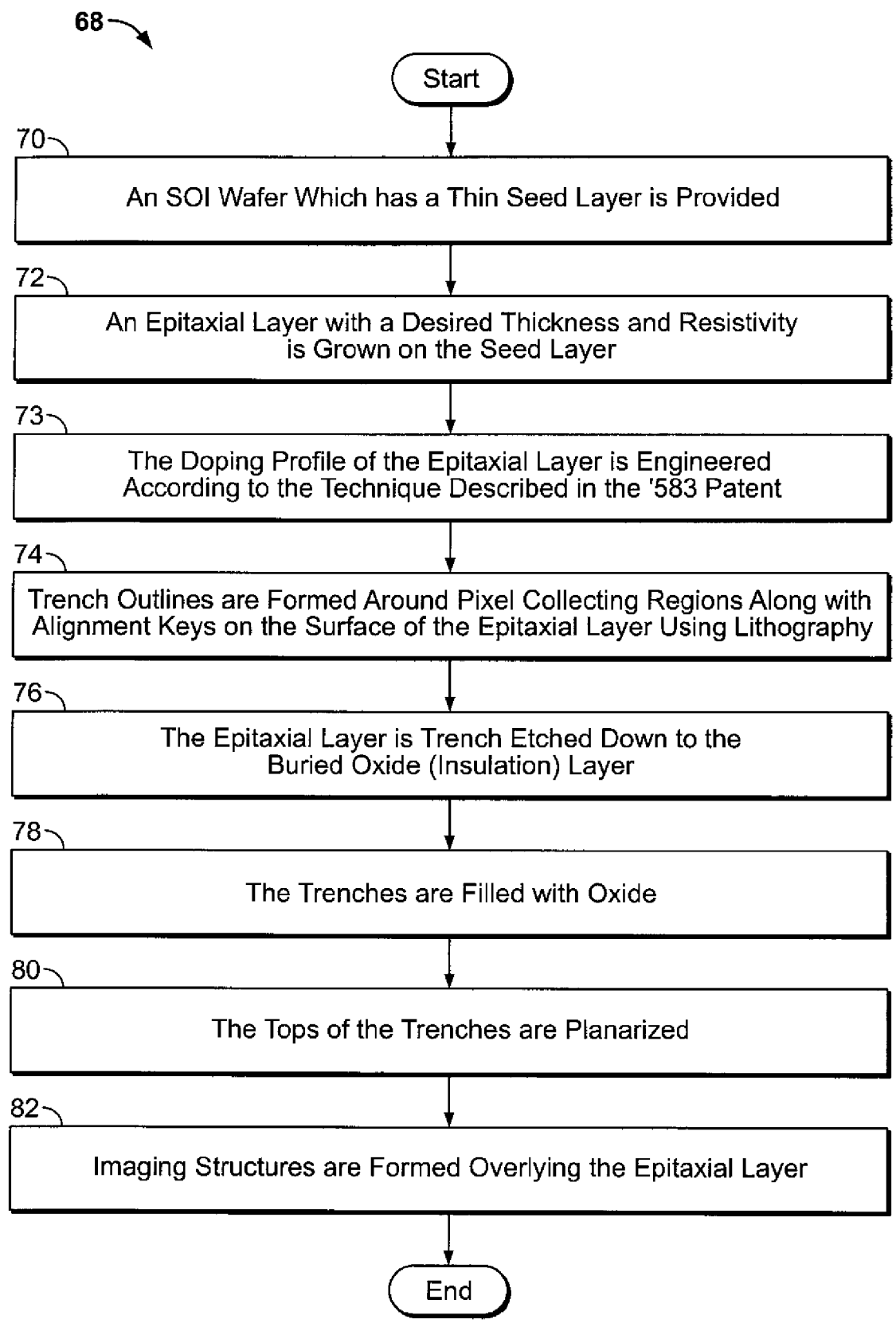
FIG. 6 is a flow diagram of a method for forming isolation barriers made from oxide trenches according to the embodiment of FIG. 5.
Figure 8:
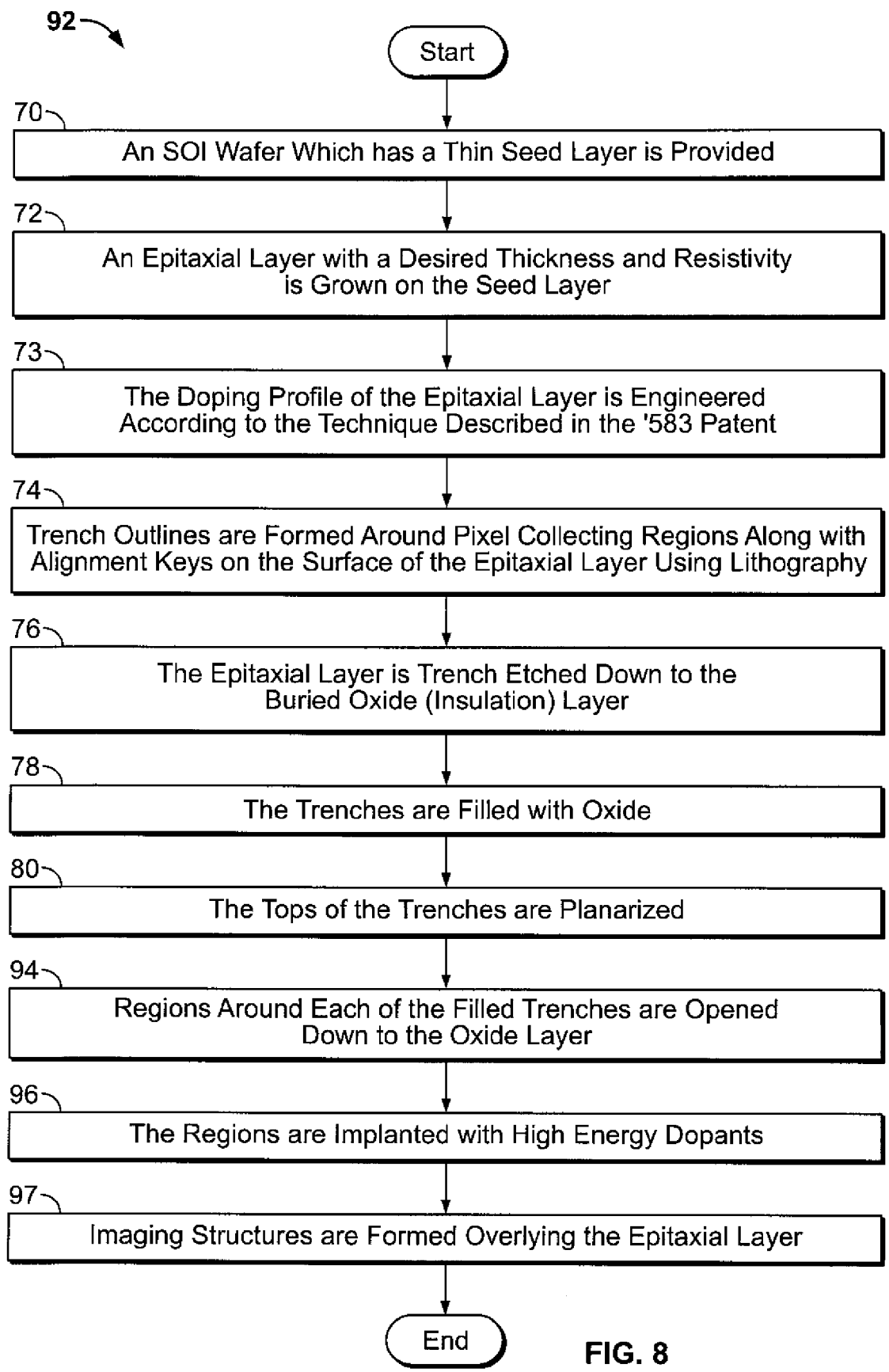
FIG. 8 is a flow diagram of a method for forming isolation barriers made from oxide trenches and high energy implants according to the embodiment of FIG. 7.

Use of both Higher Energy Implants and Oxide Trenches to Create Electrical Barriers FIG. 7 shows a cross-sectional of all imager 84 having a plurality of isolation barriers 86 formed therein by means of both oxide trenches 88 and high energy implants 90, thereby combining methods 1 and 2 by creating oxide trenches and implanting dopants around those trenches. Referring now to FIGS. 1-2 and 7 and 8, a method 92 for forming isolation barriers made from oxide trenches and high energy implants is described as follows:

The method 92 begins by performing steps 70 to 80 of the method 68 to create oxide trenches and alignment keys. At step 94, regions about each of the filled trenches are opened down to the oxide layer 18, and at step 96, the regions are implanted with high energy dopants, the dopants being thermally activated thereupon. At step 97, imaging structures 30 are formed overlying the epitaxial layer 20. Since the oxide trenches are encapsulated by dopants, the electrical barrier due to the dopants can reduce the effect of traps at the interface between the high energy dopants and the epitaxial silicon.

Method Embodiment-4

Figure 9:
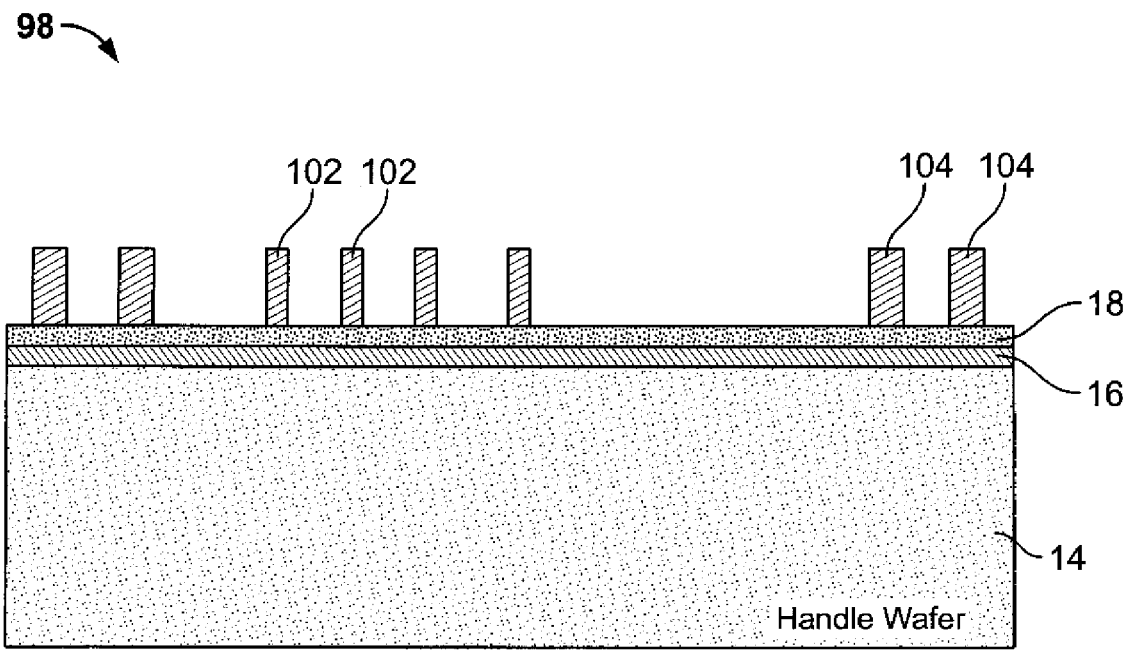
FIG. 9 shows a cross-sections of an imager having a plurality of isolation barriers formed as rings about collection well regions from oxide "pillars", according to an embodiment of the present invention.
Figure 10:
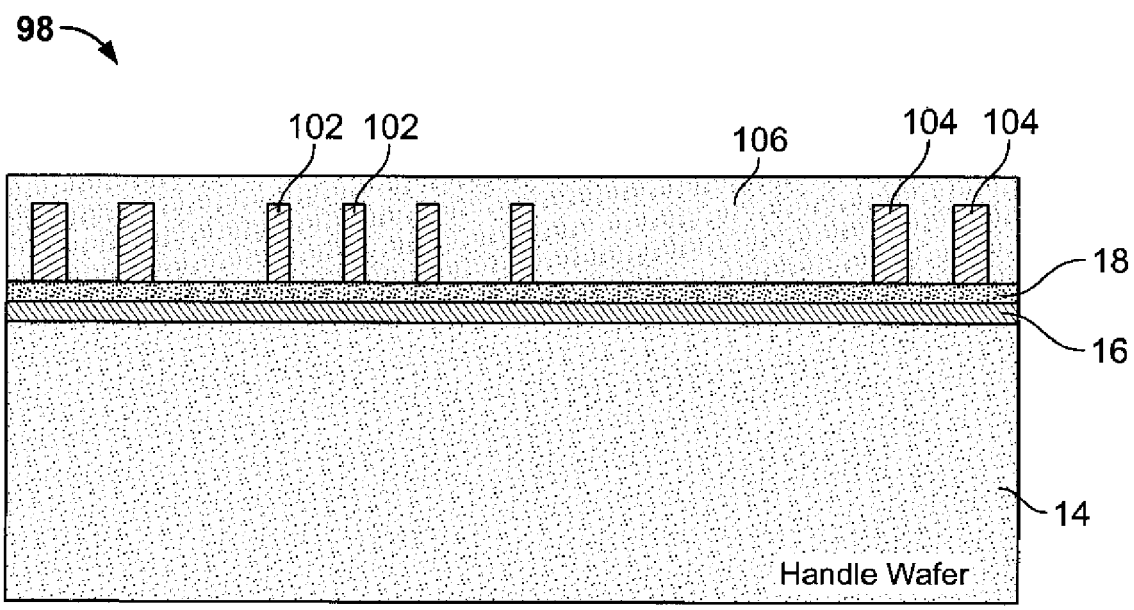
FIG. 10 shows a cross section of the imager of FIG. 9 with an epitaxial layer grown substantially about the pillars using an epitaxial lateral overgrowth (ELO) technique.
Figure 11:
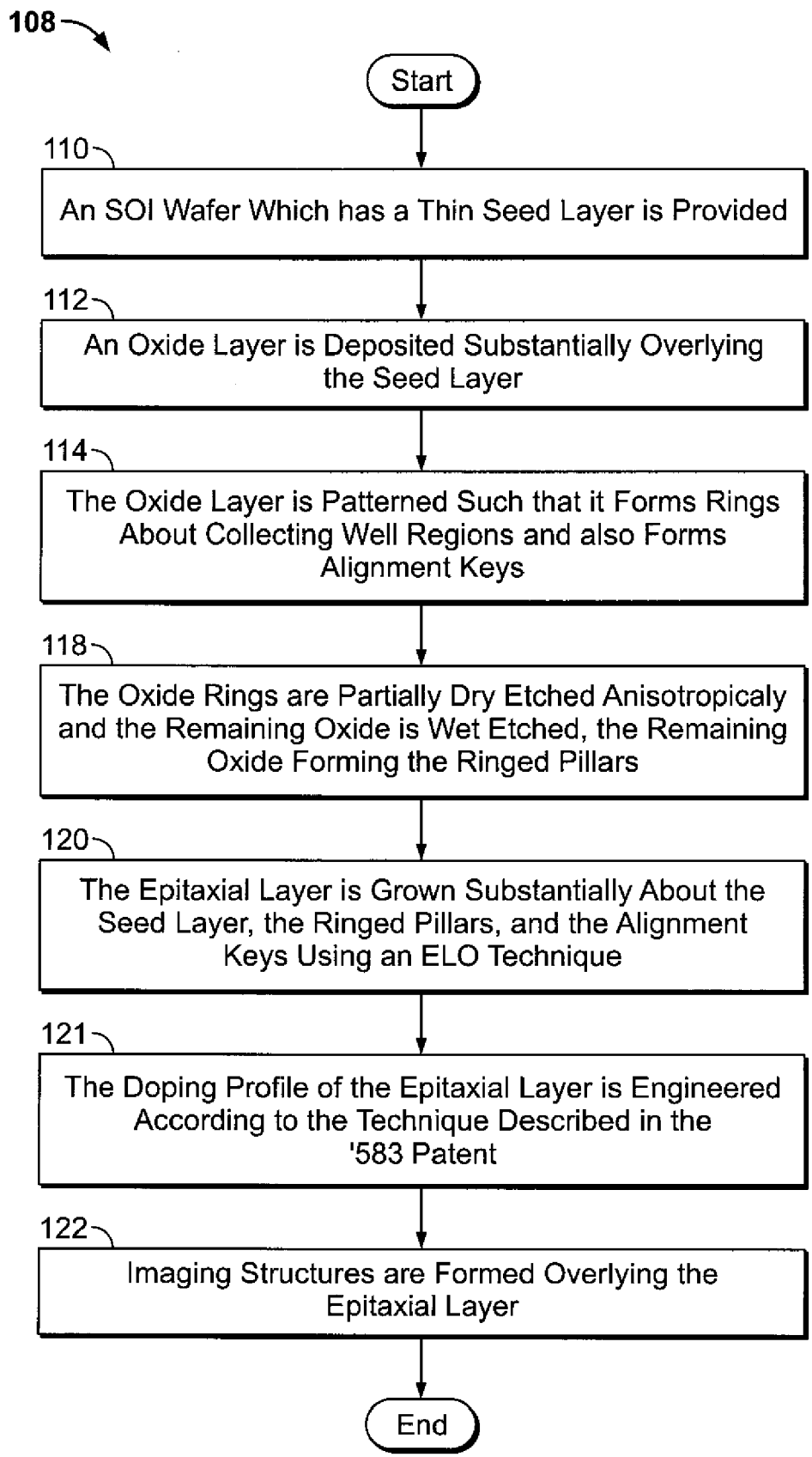
FIG. 11 is a flow diagram of a method for forming isolation barriers made from oxide pillars using an ELO technique according to the embodiment of FIGS. 9 and 10.

Use of Oxide Isolation Regions Formed by an Epitaxial Lateral Overgrowth Technique to Create Electrical Barriers FIGS. 9 and 10 show cross-sections of an imager 98 having a plurality of isolation barriers comprising oxide "pillars" 102 formed as rings about collection wells with an epitaxial layer 106 grown substantially about the pillars 102 using an epitaxial lateral overgrowth (ELO) technique. This technique completely eliminates traps created in a trench process. Referring now to FIGS. 1-2 and 9-11, a method 108 for forming isolation barriers made from oxide pillars and using an ELO technique to grow an epitaxial layer is described as follows:

At step 110, an SOI wafer 12 which has a thin Si seed layer 18 is provided. At step 112, an electrically insulating layer such as a layer of an oxide of silicon (not shown) is deposited substantially overlying the seed layer 18, the thickness of the oxide layer (about 2-10 um) being substantially similar to a final desired final epitaxial layer thickness. At step 114, the oxide layer is patterned such that it forms rings about collecting wells (not shown), and also forms alignment keys 104. At step 118, the oxide rings are partially dry etched anisotropically and the remaining oxide is wet etched, the remaining oxide forming the ringed pillars 102 having a height of about 3 um. At step 120, the epitaxial layer 106 is grown substantially about the seed Si layer 18, the ringed pillars 102, and the alignment keys 105 using an ELO technique, such as the ELO technique described in copending U.S. patent application Ser. No. 11/844,775 filed Aug. 24, 2007, which is incorporated herein by reference in its entirety. At step 121, the doping profile is also engineered during the epitaxial growth process to provide forward drift field as described in the '583 patent. At step 122, imaging structures (not shown) are formed overlying the epitaxial layer 106.

Unlike in the previous methods, the ringed pillars 102 will be standing on the Si seed layer 18. This leaves behind a continuous thin region of Si on the back surface of the imager 98. Charges generated within the seed layer 18 have a probability of diffusing to the adjacent pixels. This poses a problem when charges are generated by photons having short wavelength, such as ultraviolet (UV), and deep UV radiation. Therefore, the method 108 is preferably employed for imagers that sense visible and longer wavelength light.

Method Embodiment-5

Figure 12:
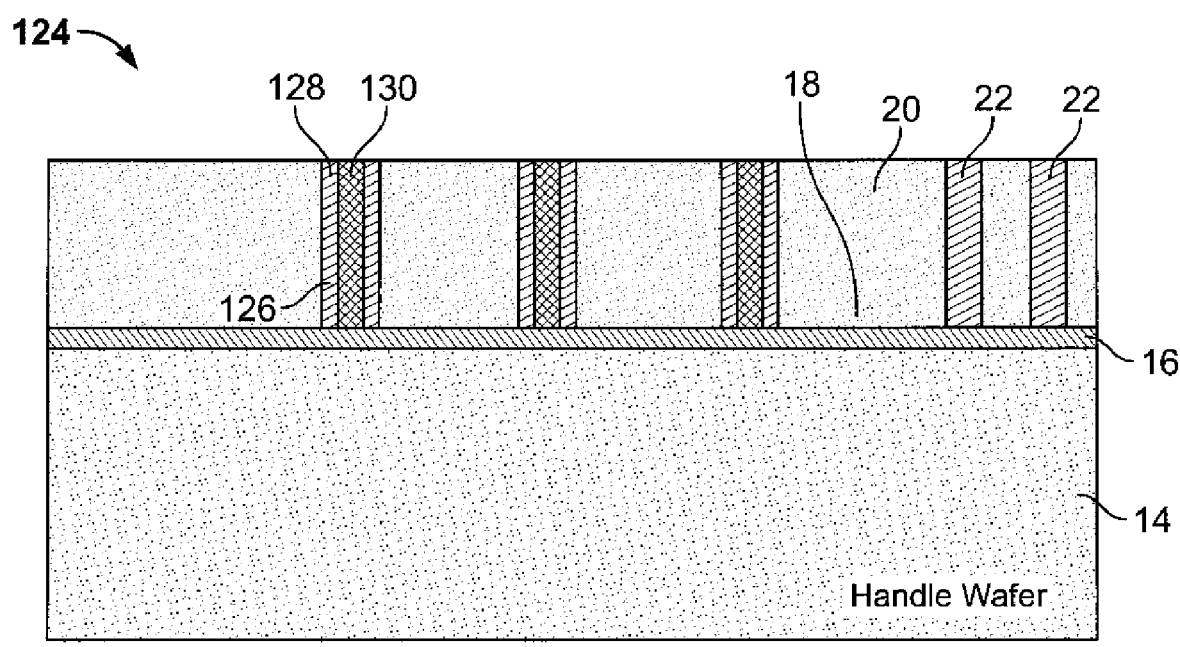
FIG. 12 shows a cross-section of an imager having a plurality of trenches formed therein that are filled with both an electrical barrier of oxide and an optically opaque material", according to an embodiment of the present invention.
Figure 13:
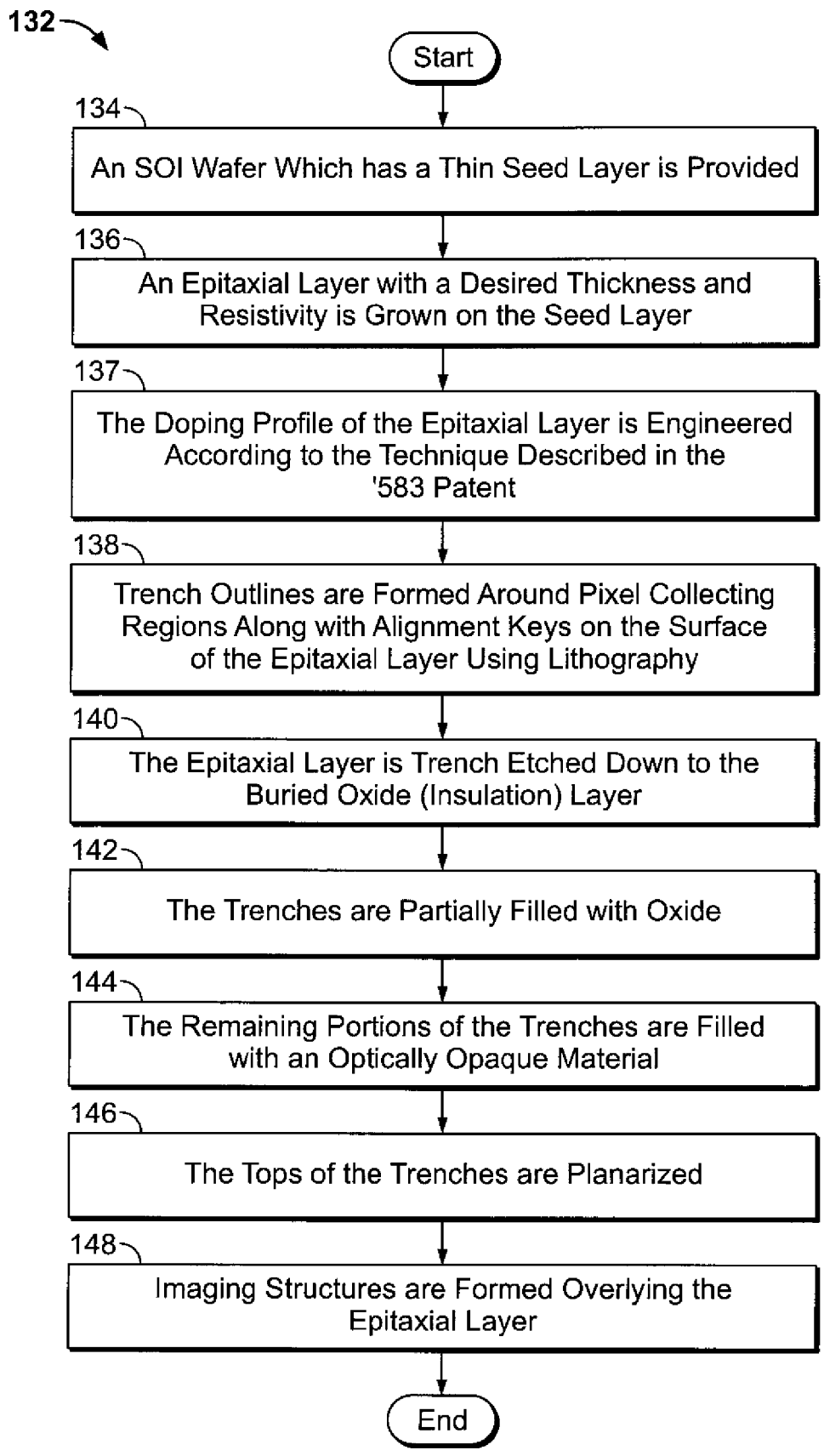
FIG. 13 is a flow diagram of a method for forming isolation barriers made from oxide and an optically opaque material according to the embodiment of FIG. 12.

Use of Isolation Regions Formed by Optically Opaque Layers to Create Optical/Electrical Barriers FIG. 12 shows a cross-section of an imager 124 having a plurality of trenches 126 formed therein that are filled with both an electrical barrier of oxide 128 and an optically opaque material 130. An optical barrier has the advantage that the light incident at an oblique angle will be reflected by the optical barrier so that it is confined within a collecting well of a pixel. Referring now to FIGS. 1-2, 12 and 13, a method 132 for forming isolation barriers made from oxide and an optically opaque material is described as follows:

At step 134, an SOI wafer 12 which has a thin Si seed layer 18 is provided. At step 136, an epitaxial layer 20 with a desired thickness (2-10 um) and resistivity is grown substantially overlying the seed layer 18. At step 137, the doping profile of the epitaxial layer 20 is engineered according to the technique described in the '583 Patent. At step 138, trench outlines are formed about pixel collection wells along with alignment keys 22 on the surface of the epitaxial layer 20 using photolithography. At step 140, the epitaxial layer 20 is trench etched down to the buried oxide (BOX) layer. At step 142, the trenches are partially filled from the top of the epitaxial layer to the top of the underlying BOX oxide layer with an electrically insulating material such as an oxide of silicon. At step 144, the remaining portions of the trenches are filled with an optically opaque material such as refractory metal. At step 146, the tops of the trenches are planarized. At step 148, imaging structures (not shown) are formed overlying the epitaxial layer 20.

Note, in some embodiments, steps 142 and 144 can be combined into one trench filling step if a material is employed that provides both an electrical barrier to charge carriers and optical barrier to electromagnetic radiation.

It is to be understood that the exemplary embodiments are merely illustrative of the invention and that many variations of the above-described embodiments may be devised by one skilled in the art without departing from the scope of the invention. It is therefore intended that all such variations be included within the scope of the following claims and their equivalents.

What is claimed is:

1. A method for reducing crosstalk in a back-illuminated imager, comprising the steps of:
providing a seed layer having a bottom surface;
forming an epitaxial layer having a top surface substantially overlying the seed layer, the epitaxial layer defining a plurality of pixel regions, each pixel region outlining a collection well for collecting charge carriers; and
implanting at least one dopant at high energy about a perimeter of the outlined collection well from the top surface of the epitaxial layer extending perpendicularly into the epitaxial layer to the bottom surface of the seed layer to form an electrical barrier.

2. The method of claim 1, further comprising the step of diffusing one or more dopants into the epitaxial layer such that, at completion of the growing of the epitaxial layer, there exists a net dopant concentration profile in the seed layer and the epitaxial layer which has an initial maximum value at the bottom surface of the seed layer and which decreases monotonically with increasing distance from the bottom surface of the seed layer within an initial portion of the seed layer and the epitaxial layer.

3. The method of claim 2, further comprising the step of forming a plurality of alignment keys substantially overlying the epitaxial layer.

4. The method of claim 3, wherein the step of forming a plurality of alignment keys substantially overlying the epitaxial layer further includes the steps of:
printing key patterns on a top portion of the epitaxial layer;
etching the underlying epitaxial layer below the key patterns using a trench etch process until the etched away silicon is stopped at the bottom surface of the seed layer; and
filling the opened trenches with an electrically insulating material.

5. The method of claim 1, further comprising the step of fabricating at least one imaging component at least partially overlying and extending into the epitaxial layer.

6. The method of claim 5, wherein the step of fabricating at least one imaging component further includes the step of fabricating at least one of a CMOS imaging component, a charge-coupled device (CCD) component, a photodiode, an avalanche photodiode, and a phototransistor.

7. A method for reducing crosstalk in a back-illuminated imager, comprising the steps of:
providing a seed layer having a bottom surface;
forming an epitaxial layer having a top surface substantially overlying the seed layer, the epitaxial layer defining a plurality of pixel regions, each pixel region outlining a collection well for collecting charge carriers;
forming trench outlines about a perimeter of the outlined collection well using photolithography on the top surface of the epitaxial layer opposite;
trench etching the epitaxial layer within the trench outlines from the top surface of the epitaxial layer extending perpendicularly into the epitaxial layer to the bottom surface of the seed layer; and
at least partially filling the trench with an insulating material to form a barrier.

8. The method of claim 7, wherein the step of at least partially filling the trench with an insulating material to form a barrier further comprises the step of:
completely filling the trench with an electrically insulating material to form an electrical barrier.

9. The method of claim 8, further comprising the step of implanting at least one dopant at high energy about the perimeter of and adjacent and external to the filled trench from the top surface of the epitaxial layer extending perpendicularly into the epitaxial layer to the bottom surface of the seed layer to form a second electrical barrier.

10. The method of claim 7, wherein the step of at least partially filling the trench with an insulating material to form a barrier further comprises the steps of:
partially filling the trench with an electrically insulating material to form an electrical barrier perpendicular to the top surface of the epitaxial layer and the bottom surface of the seed layer; and
filling a remaining portion of the trench with an optically opaque material about the perimeter of and adjacent and external to the electrically insulating material from the top surface of the epitaxial layer extending into the epitaxial layer to the bottom surface of the seed layer to form an optical barrier.

11. The method of claim 7, wherein the step of at least partially filling the trench with an insulating material to form a barrier further comprises the step of:
filling the trench with an optically opaque material to form an optical barrier perpendicular to the top surface of the epitaxial layer and the bottom surface of the seed layer.

12. A back-illuminated imaging device that minimizes crosstalk, comprising:
a seed layer having a bottom surface;
an epitaxial layer having a top surface formed substantially overlying the seed layer, the epitaxial layer defining a plurality of pixel regions, each pixel region outlining a collection well for collecting charge carriers; and
at least one high energy dopant implanted about a perimeter of the outlined collection well from the top surface of the epitaxial layer extending perpendicularly into the epitaxial layer to the bottom surface of the seed layer to form an electrical barrier.

13. The device of claim 12, wherein the seed layer and the epitaxial layer have a net dopant concentration profile which has an initial maximum value at the bottom surface of the seed layer and which decreases monotonically with increasing distance from the bottom surface of the seed layer an within an initial portion of the seed layer and the epitaxial layer.

14. The device of claim 13, further comprising at least one imaging component at least partially overlying and extending into the epitaxial layer.

15. A back-illuminated imaging device that minimizes crosstalk comprising:
a seed layer having a bottom surface;
an epitaxial layer having a top surface formed substantially overlying the seed layer, the epitaxial layer defining a plurality of pixel regions, each pixel region outlining a collection well for collecting charge carriers; and
an etched trench at least partially filled with an insulating material about a perimeter of the outlined collection well from the top surface of the epitaxial layer extending perpendicularly into the epitaxial layer to the bottom surface of the seed layer to form a barrier.

16. The device of claim 15, wherein the at least partially filled trench is completely filled with an electrically insulating material to form an electrical barrier.

17. The device of claim 16, further comprising at least one dopant implanted at high energy about the perimeter of and adjacent and external to the filled trench from the top surface of the epitaxial layer extending perpendicularly into the epitaxial layer to the bottom surface of the seed layer to form a second electrical barrier.

18. The device of claim 15, wherein the at least partially filled trench is completely filled with an optically insulating material to form an optical barrier.

19. The device of claim 18, wherein the optically opaque material is a metal.

20. The device of claim 15, wherein the at least partially filled trench is partially filled with an electrically insulating material to form an electrical barrier and a remaining portion of the trench is filled with an optically opaque material about the perimeter of and adjacent and external to the electrically insulating material from the top surface of the epitaxial layer to the bottom surface of the seed layer to form an optical barrier.

21. The device of claim 20, wherein the optically opaque material is a metal.

* * * * *